United States Patent [19]
Puri et al.

[11] Patent Number: 6,018,621
[45] Date of Patent: Jan. 25, 2000

[54] IDENTIFYING AN OPTIMIZABLE LOGIC REGION IN A LOGIC NETWORK

[75] Inventors: Ruchir Puri, Danbury, Conn.; Andrew Augustus Bjorksten; Thomas Edward Rosser, both of Austin, Tex.

[73] Assignee: International Business Machines Corporation, Armonk, N.Y.

[21] Appl. No.: 08/761,891

[22] Filed: Dec. 9, 1996

[51] Int. Cl.[7] ................................................ G06F 17/50
[52] U.S. Cl. ................................................ 395/500.02
[58] Field of Search ....................... 364/488; 395/500.02

[56] References Cited

U.S. PATENT DOCUMENTS

| | | | |
|---|---|---|---|
| 3,643,861 | 2/1972 | Eckerlin | 235/201 |
| 3,698,632 | 10/1972 | Eckerlin | 235/201 |
| 4,631,424 | 12/1986 | Miyagi | 326/120 |
| 4,868,773 | 9/1989 | Coyle et al. | 708/304 |
| 5,477,164 | 12/1995 | Denker | 326/21 |
| 5,508,937 | 4/1996 | Abato et al. | 364/488 |
| 5,522,063 | 5/1996 | Ashar et al. | 395/500.05 |
| 5,553,000 | 9/1996 | Dey | 364/488 |

*Primary Examiner*—Kevin J. Teska
*Assistant Examiner*—Thuan Do
*Attorney, Agent, or Firm*—Anthony V.S. England

[57] ABSTRACT

At least one certain type of logic gates, such as NOT gates, in a network of logic gates are moved to the network inputs and outputs, by converting the logic gates in the network to certain types of gates, such as AND, OR and NOT gates. A region in the network is identified for selecting, within the region, between propagating the one certain type of gates to a) the network inputs, and b) the network outputs. The region is identified in response to "reconvergent fanout nodes". A reconvergent fanout node defines a loop having two branches which diverge at the node and reconverge thereafter.

20 Claims, 10 Drawing Sheets

PROBLEM

Input : logic network with AND/OR/NOT gates;
Output: candidates nodes $\{C_N\}$ for logic optimization;

Procedure candidate_nodes() {
begin
  for each primary output $O_j$
    initialize output phase assignment of corresponding node $N_j$ as
        $\{v_{i_1} = \text{-}, v_{i_2} = \text{-}, ..., v_{i_j} = P, ..., v_{i_m} = \text{-}\}$;
  levelize logic from primary outputs to primary inputs and
        start traversal from primary outputs;
  for each gate $G$
  begin
    if gate $G$ is not *duplicated*
    begin
      if gate $G$ is of type AND or OR
        then propagate the phase assignment of its output to its input nodes,
          i.e.,$\{v_{in}\} = \{v_o\}$;
      if gate $G$ is of type NOT
        then propagate the complimentary plase assignment of its output
          to its input nodes, i.e.,$\{v_{in}\} = \{\overline{v_o}\}$;
      for each input $N_j$ of gate $G$
        if previous assignment of node $N_j$, i.e., $\{v_j\}$ is conflicting with the
          assignment propagated by gate $G$, i.e., $\{v_{in}\}$ for any primary output
        then mark all the gates in fanin logic cone of node $N_j$ as *duplicated*;
        else update the phase assignment of input node $N_j$ by combining its previous
          assignment $\{v_j\}$ and propagated assignment $\{v_{in}\}$, i.e.,$\{v_j\} := \{v_j\} \cup \{v_{in}\}$;
    end;
  end;
  for each fanout node $N_j$ in the optimizable logic region
  begin
    if any two phase assignments it receives from its fanout gates are disjoint
      then fanout node $N_j$ is a *candidate* node for optimizing inverter free logic, i.e.,
        candidate set $\{C_N\} := \{C_N\} \cup N_j$;
  end;
end;

FIG. 8

IDENTIFYING AN OPTIMIZABLE LOGIC REGION IN A LOGIC NETWORK

CROSS REFERENCE TO RELATED PATENT APPLICATIONS

This application is related to the following applications:

Identifying Candidate Nodes for Phase Assignment in a Logic Network, Ser. No. 08/761,980; and Selecting Phase Assignments for Candidate Nodes in a Logic Network, Ser. No. 08/763,980.

This application and the related applications are filed on even date herewith and are assigned to a common assignee. The related applications are hereby incorporated herein by reference.

1. Field

This invention relates generally to digital logic, and more specifically may apply to a network of logic gates, such as dynamic logic gates, which requires that inverters be only at the inputs or outputs of the network.

2. Background

The use of dynamic logic is an efficient way of increasing circuit speed and reducing die area of integrated circuitry. Many dynamic circuit schemes have been described which share common basic features. The basic dynamic gate, shown in FIG. 1, includes a logic structure whose output node O is precharged to V_DD by a p-type transistor (the "precharge" transistor) and conditionally discharged to ground by an n-type transistor (the "evaluate" transistor). The precharge and evaluate transistors are connected to a single phase clock. During the precharge phase, the clock is low and the output node is precharged to V_DD. At the completion of precharge phase, the clock goes high and the path to V_DD is turned off while the path to ground is conditionally turned on. In this evaluate phase, depending on the state of the inputs, the output will either be at a high level or will be pulled down.

This dynamic logic is advantageous in that it generally requires less transistors than static logic. However, one major limitation of the basic dynamic CMOS gate as described above is that it cannot be cascaded. If two such basic gates are cascaded, as shown in FIG. 2, then during the precharge phase, the cascaded dynamic gates, G_1 and G_2 are precharged, i.e., dynamic output nodes O_1 and O_2 are precharged to V_DD. During the evaluate phase, the output of the first gate G_1 will conditionally discharge depending on its inputs. However, some delay will be incurred due to the pull-down time of the gate. During this delay, all the inputs of next gate, G_2, remain precharged high and the evaluate transistor is also conducting (evaluate phase). Thus, the precharged output node O_2 can be discharged due to the delay of the previous stage, causing the output node O_2 to switch erroneously.

Domino logic, one example of which is illustrated in FIG. 3, overcomes the cascading problem of the basic dynamic logic structure. Domino logic allows a single clock to precharge and evaluate a cascade of dynamic logic blocks due to the static CMOS inverting buffer at the output of the dynamic logic gate. In cascaded domino logic blocks, each stage evaluates and causes the next stage to evaluate. During precharge, the output node of the dynamic gate is precharged high and the output of the inverting buffer is low. As subsequent domino logic stages are fed from this inverting buffer, their transistors will be turned off during the precharge phase. When the gate is evaluated, the output will conditionally discharge, causing the output of the inverting buffer to conditionally go high. Thus during the evaluate phase, the output of each dynamic gate in the cascade can make at most one transition, i.e., high to low. Hence, the output of the inverting buffer can only make a transition from low to high, enabling the cascading of dynamic logic stages.

Domino logic offers improvements over static logic in circuit area, and speed. But, since the evaluation logic of a domino gate, like that of a basic dynamic gate, has only N-type transistors, this logic must be non-inverting. Therefore, a need exists for a practical method and apparatus for designing logic which is free of inverters.

SUMMARY

An objective of the invention is to move INVERT logic gates (i.e., NOT gates) in a logic network to the network boundary (i.e., network inputs or outputs).

According to the present invention, the foregoing and other objects are attained by converting logic gates in the network to AND, OR and NOT gates, and identifying a region in the network for selecting, within the region, between propagating the NOT gates to a) the network inputs, and b) the network outputs.

The invention further contemplates that the region is identified in response to reconvergent fanout nodes. A reconvergent fanout node is a node which is at the root of a loop having two paths which diverge (i.e., fanout) from the node toward the outputs of the network and which reconverge thereafter. The two paths may be referred to as two "branches", although there actually may be more than one branch in a path, since a branch is actually a path from one node to another node or to the input of a gate.

In another aspect, the difference between the number of NOT gates in the two branches is an odd number.

Also, in another aspect, the region excludes that portion of the network which is in the fan-in cones of the reconvergent fanout nodes. The fan-in cone of a node includes the branches from one or more inputs of the network to the node.

It is an advantage of the present invention that the region so identified may define a subset of the network, so that less than the whole network needs to be considered for propagating NOT gates to outputs of the network.

Additional objects, advantages, and novel features are set forth in the following description, or will be apparent to those skilled in the art or those practicing the invention. Other embodiments are within the spirit and scope of the invention. These objects and embodiments may be achieved by the combinations pointed out in the appended claims. The invention is intended to be limited only as defined in the claims.

BRIEF DESCRIPTION OF THE DRAWINGS

FIG. 8 sets forth pseudo code for identifying candidate nodes.

DETAILED DESCRIPTION

To clearly point out novel features of the present invention, the following discussion omits or only briefly describes conventional features of logic networks which are apparent to those skilled in the art. For example, it is assumed that those skilled in the art are familiar with boolean logic transformations.

The inverter-free constraint in domino logic requires that all logic inversions be performed at the clock phase boundaries, i.e., at the primary inputs or primary outputs, where the inverters can be absorbed in registers. As a first step in designing such unate logic, conventional logic, which may include NAND and NOR gates for example, are converted into AND, OR, and NOT gates only. See, for example, Edward McCluskey, Logic Design Principles, 1986, chapter 2 which is hereby incorporated by reference (describing methods for reducing one logic network into another, equivalent network).

Figure 1:
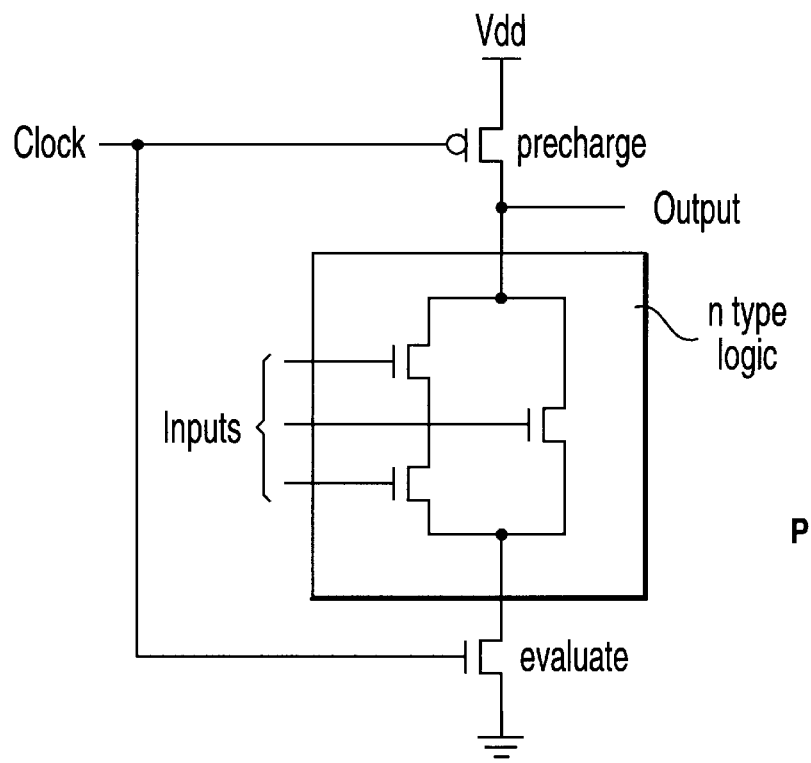
FIG. 1 is a basic dynamic gate. (Prior art)
Figure 2:
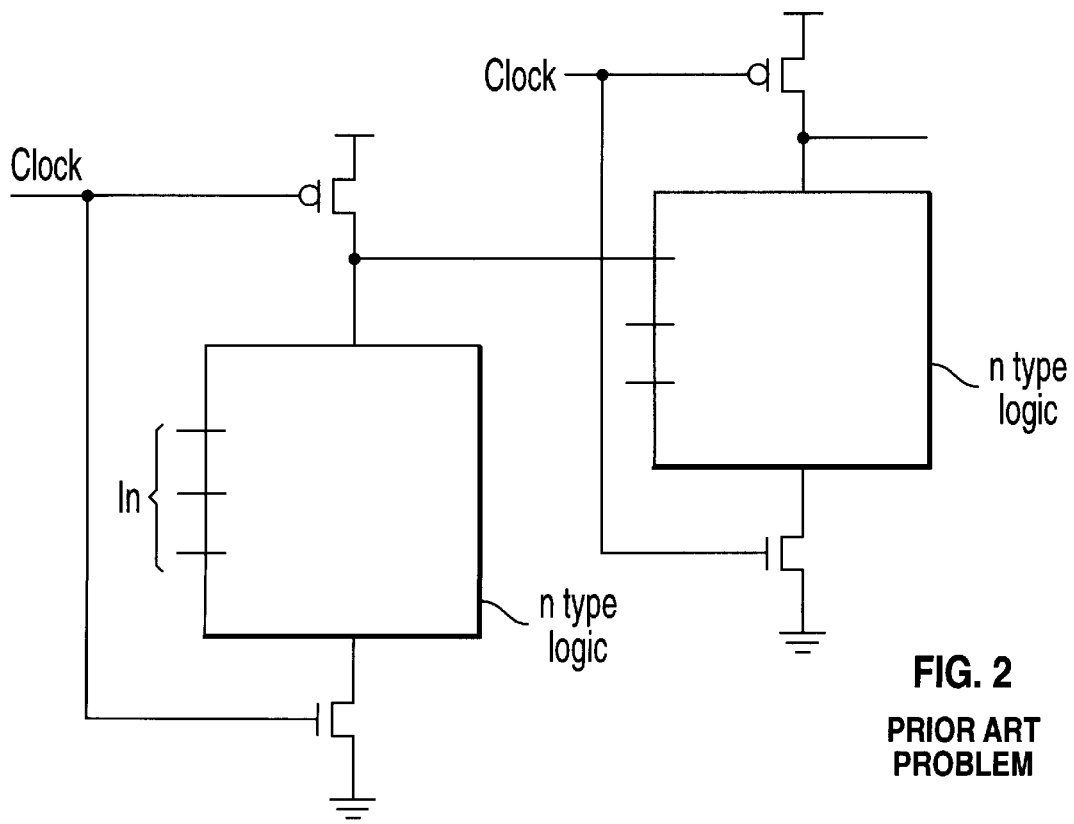
FIG. 2 shows two such basic dynamic gates connected in cascade, to illustrate the problem created with this configuration. (Prior art)
Figure 3:
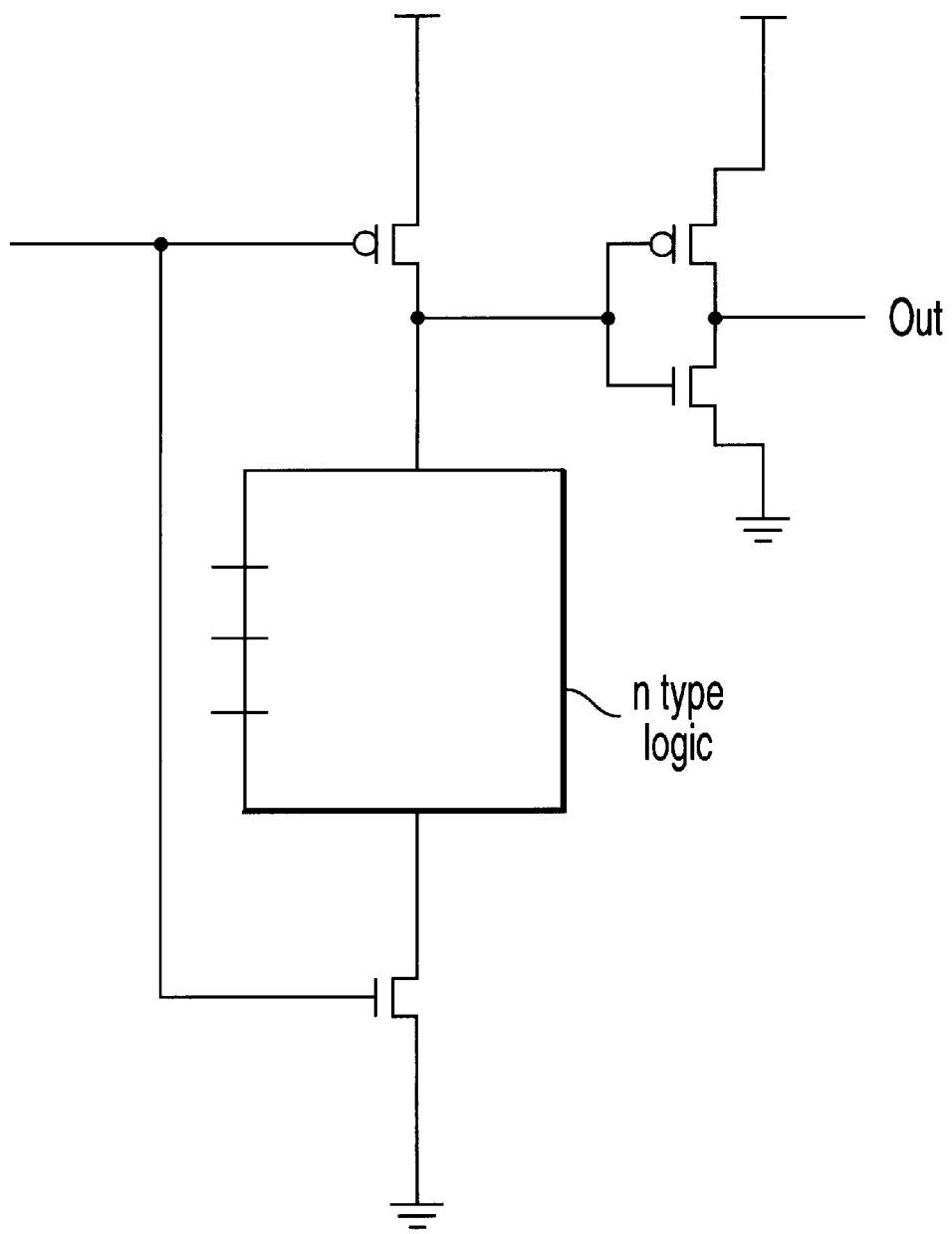
FIG. 3 is a domino dynamic gate. (Prior art)
Figure 4A:
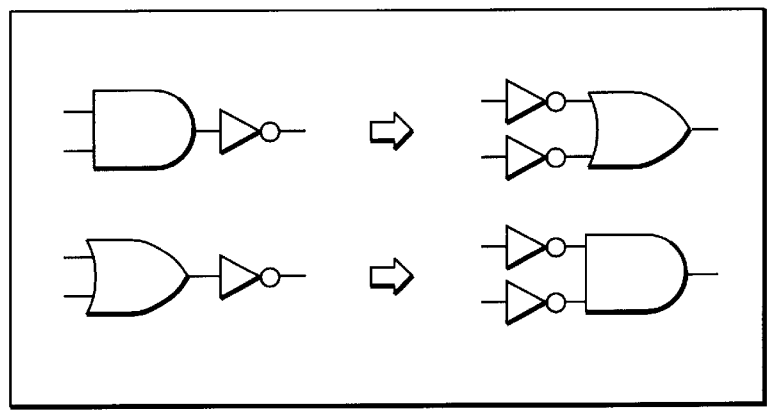
FIG. 4 illustrates propagating an inverter from one network location to another.

FIG. 4 illustrates propagating an inverter from one network location to another. Inverters may be propagated toward the inputs by applying simple De Morgan's laws, as shown in FIG. 4(a), starting at the primary outputs. See, for example, M. Mano, Digital Logic and Computer Design, 1979 (describing De Morgan's laws), which is hereby incorporated by reference.

Figure 4B:
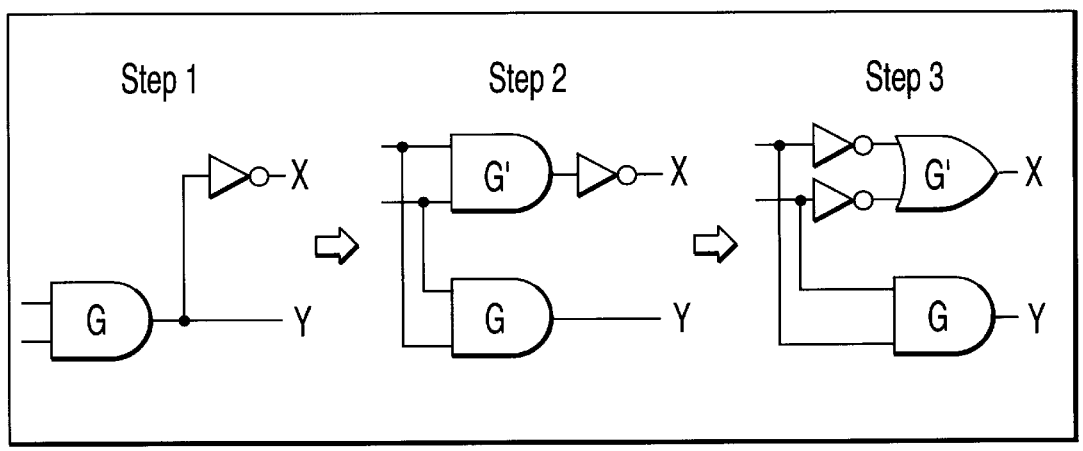

An inverter propagated toward the inputs may, however, become "trapped" at a fanout node (i.e., the node at the root of a network that fans out toward outputs), as shown in step 1 of FIG. 4(b). That is, the inverter cannot be propagated back toward primary inputs without duplicating the logic gate that is feeding the fanout node. In such a case, the gate preceding the fanout node may be duplicated, as in FIG. 4(b) step 2, for implementing both positive and negative phases and the inverter pushed backward (i.e., toward inputs), as shown in FIG. 4(b) step 3.

The above steps are again illustrated in FIG. 5. Logic gates 501 through 509 in FIG. 5(a), which include NAND, NOR, AND, OR and NOT gates, are converted solely to AND, OR and NOT gates 501, 502, 504, 505, 507, and 509 through 515 in FIG. 5(b). Next, inverters in the logic network are propagated back toward inputs until they are trapped at some intermediate fanout node without duplicating logic. A first step in this propagation is illustrated in FIG. 5(c), where gates 511, 512 and 513 of FIG. 5(b) have become gates 520 and 521. Also, gates 507, 514 and 515 of FIG. 5(b) have become gates 522 and 523. A second step in the propagation is illustrated in FIG. 5(d), where gates 505 and 521 of FIG. 5(c) have become gates 525, 526 and 527. In a third step, illustrated in FIG. 5(e), gates 522 and 526 of FIG. 5(d) have become gate 530. Also, gates 504 and 527 have become gate 531. In FIG. 5(e), inverters are trapped at fanout nodes N_1 and N_2.

Figure 5A:
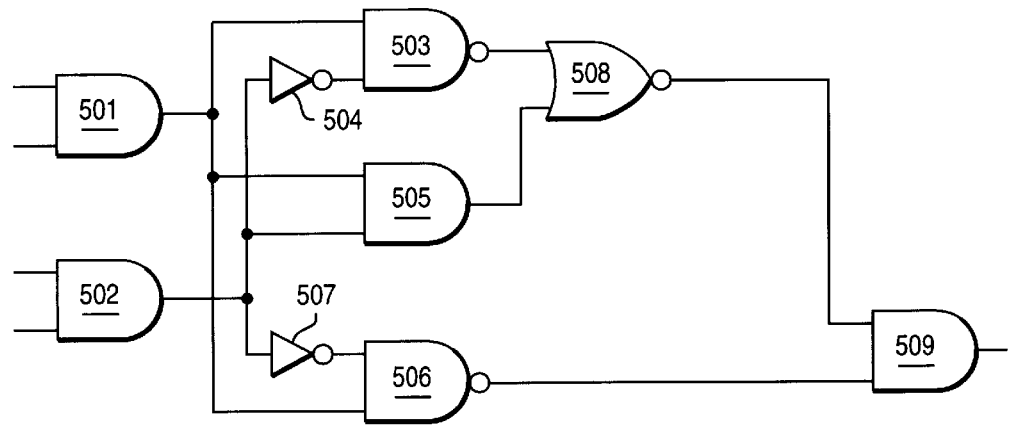
FIGS. 5a–5f illustrates some of the steps for converting a logic network to a unate logic network.
Figure 5B:
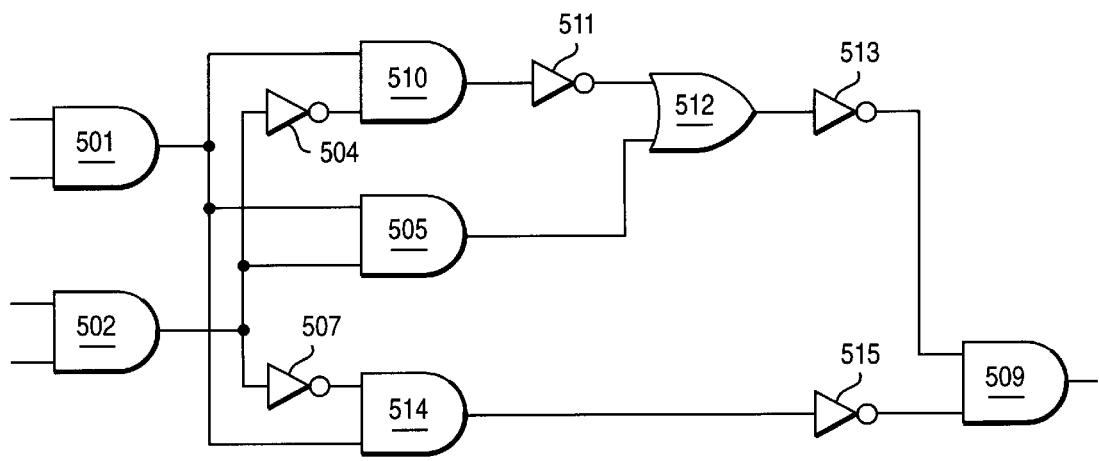
Figure 5C:
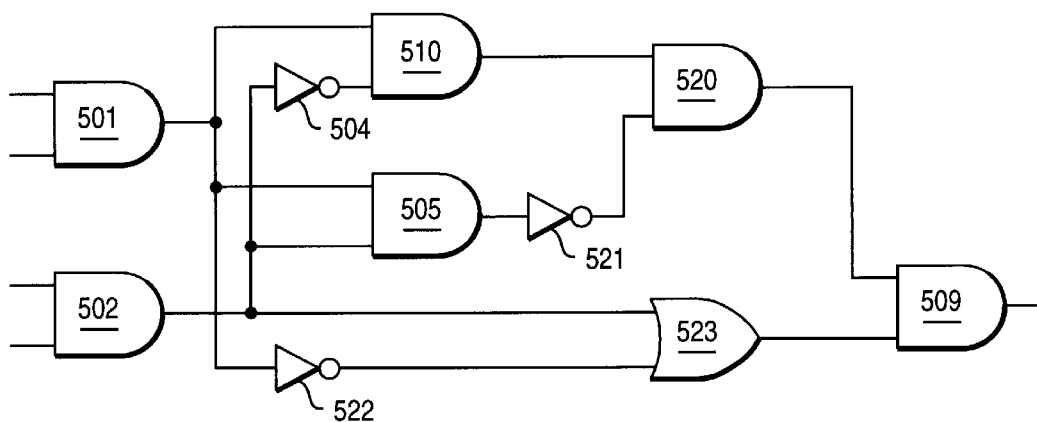
Figure 5D:
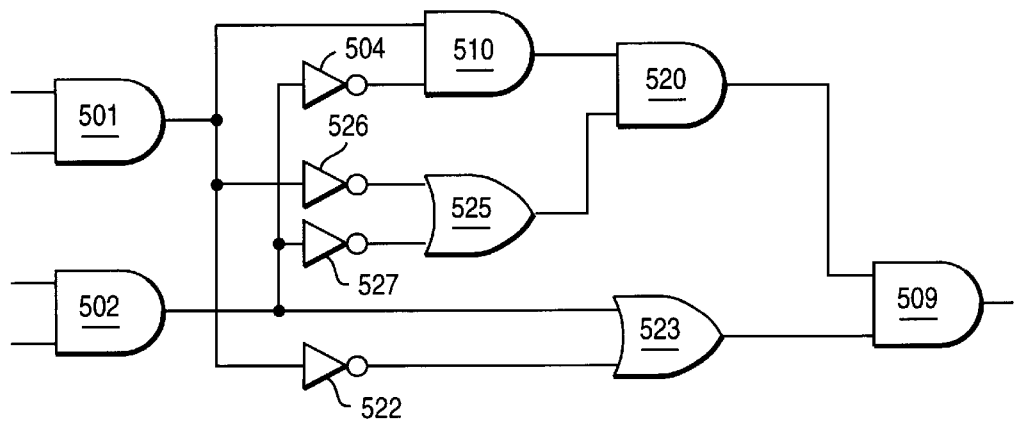
Figure 5E:
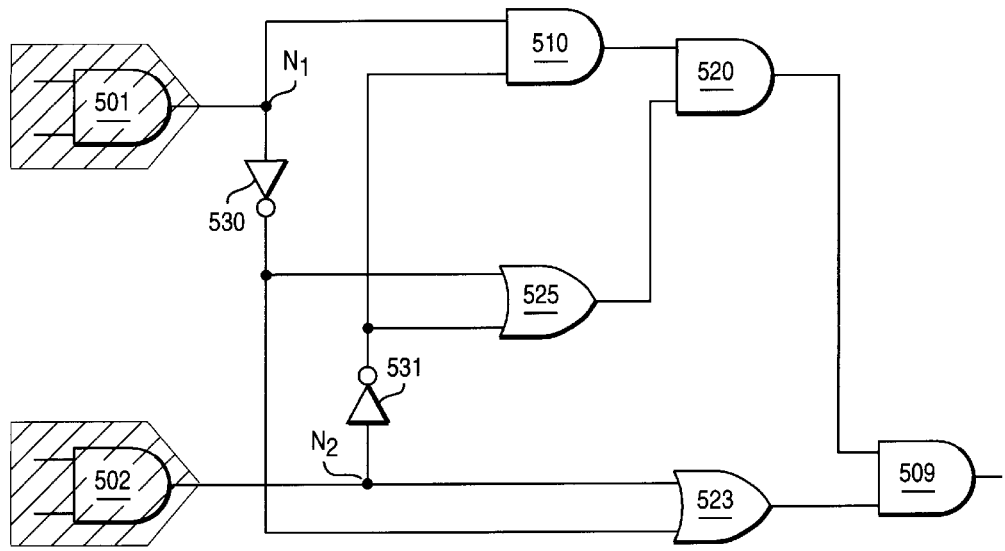
Figure 5F:
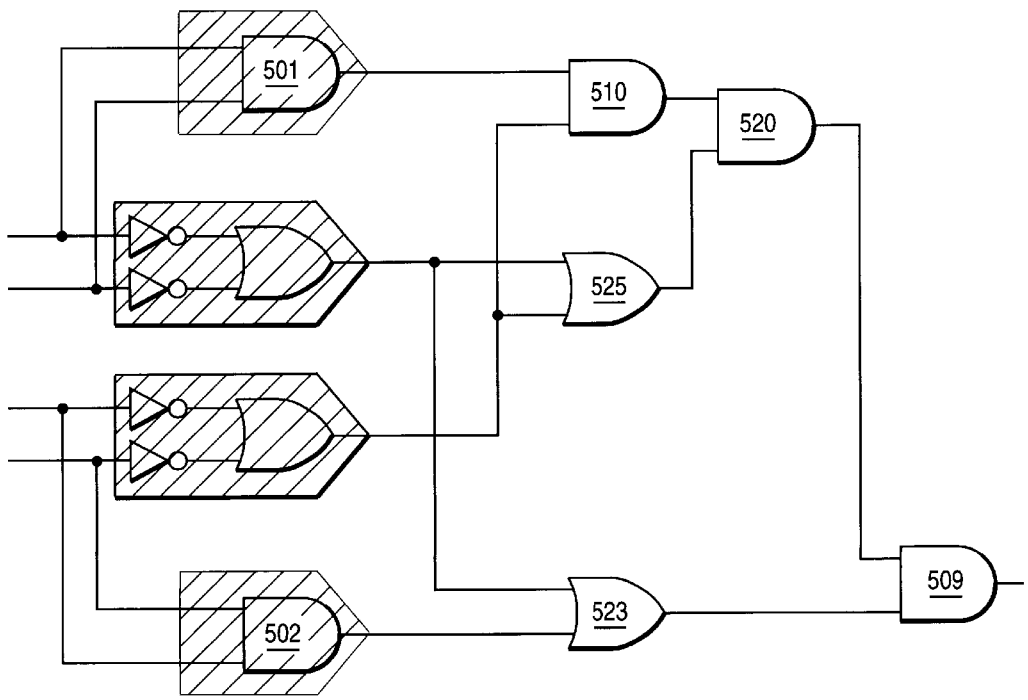

In some cases, an inverter trapped at a fanout node can be removed either of two ways. As illustrated in FIG. 5(f), for example, the trapped inverters at nodes N_1 and N_2 can be removed by duplicating the fanin logic cone of the node, i.e., implementing both the positive and the negative phases at the fanout node. (The fan-in cone of a node includes the branches from one or more inputs of the network to the node.) Alternatively, a trapped inverter can be removed by properly selecting the primary output phases of the primary outputs in the fanout cone of the node.

Figure 6:
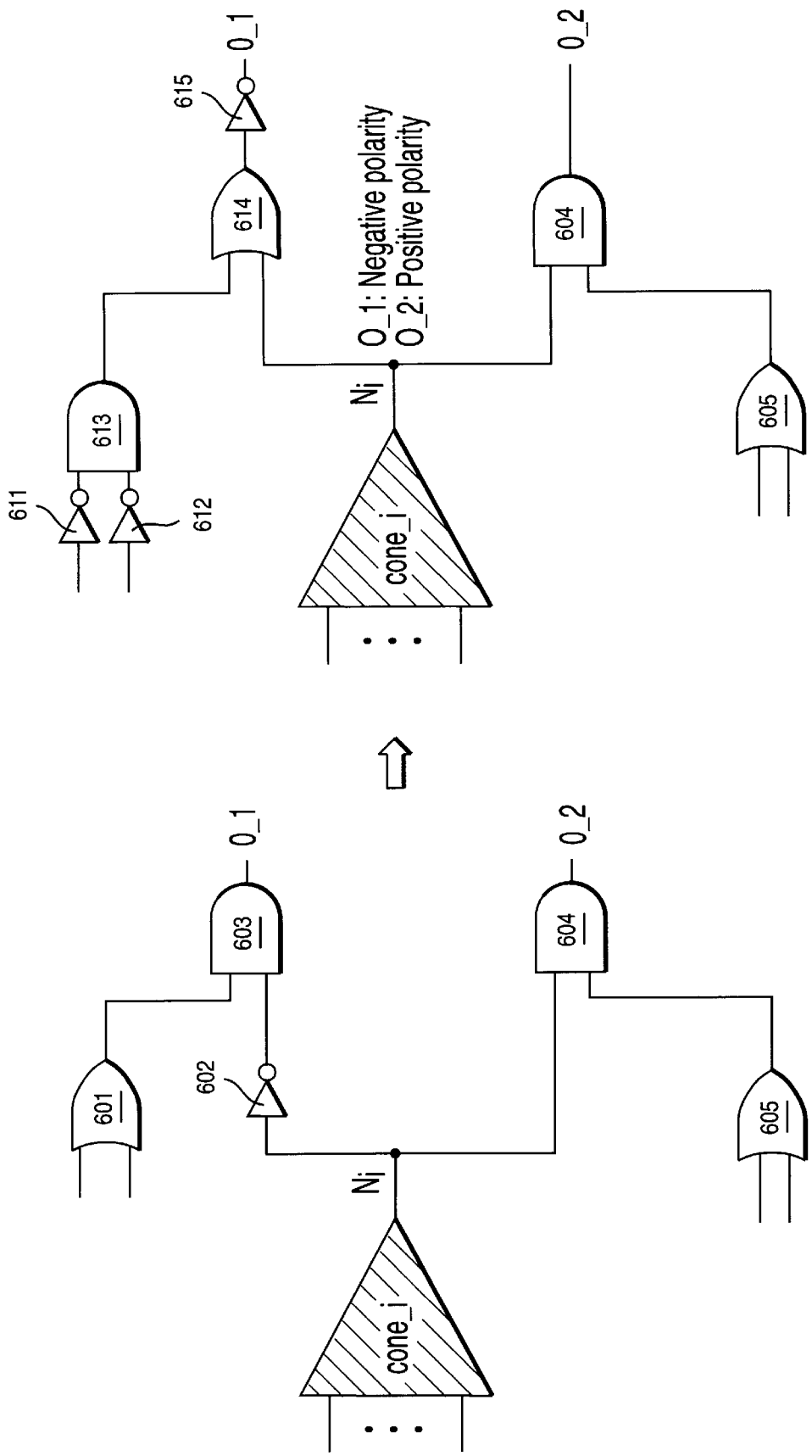
FIG. 6 illustrates output phase assignment for moving an inverter to an output.

Referring now to FIG. 6, the elimination of an inverter at a fanout node by changing output phase assignment is illustrated. In order to eliminate the inverter trapped at the fanout node N_i, output O_1 must be implemented with a negative phase and output O_2 must be implemented with a positive phase. (The logic function of gates 601 through 605 in FIG. 6(a) and the logic function of gates 604, 605, and 611 through 615 are equivalent.) This moves the inverter from the fanout node N_i to the network boundary. The inverter required for implementing output O_1 in negative phase can be absorbed at the network boundary in a register.

The phase assignment alternative avoids the logic duplication of the first, and is therefore generally preferred. However, there are cases where inverters that are trapped at intermediate nodes cannot be eliminated by phase assignment. Thus, both the logic duplication and phase assignment alternatives must ordinarily be used. Ideal selection of output phase assignments will minimize the use of logic duplication, but the choices are often numerous and complex. That is, there may be many inverters in the network, and the choices for one inverter are often interdependent on the choices for another inverter. In the following, a system for choosing between forward and backward propagation of an inverter is set forth.

Fanout nodes can be divided into two categories: reconvergent and non-reconvergent fanout nodes. A reconvergent fanout node is the root of a closed loop of gates (the "fanout loop"), such as shown in FIG. 5(e), node N_1 and gates 510, 520, 525 and 530. A node such as this defines a loop having two branches which diverge (i.e., fanout) from the node toward the outputs of the network and which reconverge thereafter. The path from node N_1 through gates 510 and 520 define a branch in the fanout loop. The path from N_1 through gates 530, 525 and 520 define a second such branch.

An inverter will be trapped in the fanout loop only if the difference in the number of inverters between the two branches is an odd number. That is, because of the imbalance of inverters in the two paths, the trapped inverter cannot by removed by pushing it either backward or forward. In such a case, no selection of output phase assignment exists which can eliminate the inverter, because this inverter can only be made to toggle between the two branches. To eliminate such an inverter, the logic gates within the fanin cone rooted at the reconvergent fanout node must be duplicated. Thus, the logic which must be duplicated in the fanin cones of all the reconvergent fanout nodes with trapped inverters defines a "duplicated logic region". The remaining logic defines an "optimizable logic region", which may have inverters that can be eliminated by either logic duplication or output phase assignment.

These distinctions are helpful for minimizing logic duplication in the process of moving inverters to the logic boundary. None of the nodes in the duplicated logic region need be considered for minimizing logic duplication, since the logic in their fanin cones has already been duplicated.

To facilitate identifying the logic duplication boundary in a structured fashion, certain generalized terminology and initialization procedures are set forth as follows. In a combinational logic network with m primary outputs O_1 through O_m, a phase assignment vector, $v\_i\_1, v\_i\_2, \ldots, v\_i\_m$, is associated with every fanout node N_i in the logic network. The value of the phase assignment $v\_i\_j$ for node N_i, derives from the phase assignment of primary output O_j, which may be positive ("P") or negative ("N"). That is, the phase assignment, $v\_i\_j$, is the value of the output, O_j, reflected back to the node, N_i.

An output phase assignment is reflected back to a node through the logic gates between the node and the output as follows. Initially, the primary outputs are assumed to have positive phase assignments. For an AND or an OR gate, the input pins of the gate are given the same phase assignment as its output. For a NOT gate, the phase assignment of the input pin of the gate is the complement of its output. If output $O\_j$ is not in the fanout cone of node $N\_i$, then node $N\_i$ is not affected by this output and the corresponding phase value $v\_i\_j$ is assigned a don't care value (indicated by a "—").

Based on the above, it should be understood that a fanout node, $N\_i$, may receive multiple, possibly conflicting phase assignments, since it may have multiple branches leading to a single output. If a fanout node $N\_i$ receives conflicting phase assignment for an output $O\_j$, i.e., both negative and positive, then it is the root of a fanout loop with a trapped inverter. This makes node $N\_i$ a node on the logic duplication boundary, and implies that all the nodes in the fanin cone of node $N\_i$ can be eliminated from consideration for minimizing logic duplication.

It should also be understood that a fanout node may receive phase assignments from multiple branches that do not conflict, since a positive or a negative phase assignment from one branch may be combined with a don't care phase assignment from another branch, which will not change the positive or negative phase assignment. Likewise, the multiple branches may have the same phase assignment, so that no conflict arises.

Note the useful implications of the above for identifying reconvergent fanout nodes with trapped inverters. That is, in general terms, if $O\_j$ is in the fanout cone of $N\_i$ and every path from $N\_i$ to $O\_j$ contains an even number of inverters, then, based on a positive initial output phase assignment, corresponding phase assignment $v\_i\_j$ is defined as positive. Similarly, if every path from $O\_j$ to $N\_i$ contains an odd number of inverters then corresponding phase assignment $v\_i\_j$ is defined as negative. If one path from $N\_i$ to $O\_j$ contains an even number of inverters and another path contains an odd number of inverters, then there will be two conflicting values of $v\_i\_j$, i.e., positive due to the path with even number of inverters and negative due to the path with odd number of inverters. This condition characterizes a reconvergent fanout node with a trapped inverter.

By applying the above structured analysis, the duplicated logic and optimizable logic regions can be distinguished through a traversal from primary outputs toward primary inputs. This is further illustrated in FIG. 7 with an example. After the initial step of propagating inverters toward primary inputs without any logic duplication, two inverters inv_1 and inv_2 are trapped at fanout nodes N_2 and N_9 respectively. To find the duplicated logic region and the optimizable logic region, the phase assignments are initialized at the primary outputs and they are propagated toward primary inputs.

Following the terminology and procedures set forth above, fanout node N_2 receives a phase assignment [N,—] from output O_1 through gates G_1 and inv_1, and a phase assignment [—,P] from output O_2 through gate G_2. These two assignments are combined to yield the phase assignment of fanout node N_2, [N,P]. Similarly, the phase assignment of fanout node N_3 can also be obtained as [N,P]. Fanout node N_9 receives a phase assignment of [P,N] through inv_2 and a phase assignment of [N,P] through gate G_10. Since these two assignments are conflicting, node N_9 is at the root of a fanout loop having a trapped inverter. The first branch of the loop is through inv_2 and G_5 to G_6. The second branch is through G_10 and G_9 to G_6.

Because inv_2 is trapped in a fanout loop, inv_2 cannot be removed by output phase assignment. Therefore, the fanin cone, G_12, G_13, and G_14, of the root node, N_9, for the loop must be duplicated in order to remove inverter inv_2.

Similarly, fanout node N_6 receives conflicting assignments [P,P] from gates G_3 and [N,P] from gate G_4. Thus fanout node N_6 is also the root of a fanout loop having a trapped inverter, inv_1. The first branch of this loop is through G_3, to G_1. The second branch is through G_4, G_5 and G_6 and inv_1 to G_1. In other terms, the loop is defined by N_6, N_1, O_1, N_2, N_4, N_3 and N_6.

This analysis yields a duplicated logic region containing gates G_8, G_12, G_13, and G_14, with nodes N_6 and N_9 defining the boundary of the region. The optimizable logic region contains the rest of the network, i.e., nodes N_1 through N_5, N_7 and N_8, and gates G_1 through G_6, G_9 through G_10, inv_1, and inv_2.

If there is no inverter trapped in a reconvergent fanout loop, then a trapped inverter cannot be produced merely by phase assignment. Thus, within the optimizable logic region, inverter-free reconvergent fanouts need not be considered for logic optimization by output phase assignment. Only non-reconvergent fanout nodes in the optimizable logic region must be considered for minimizing logic duplication. These non-reconvergent fanout nodes are candidate nodes for determining the output phase assignment. Identifying the candidate nodes may significantly reduce the number of nodes that must be considered for an optimal output phase assignment to minimize logic duplication; however, it may still be rather complex merely to find all the candidate nodes. The following describes an efficient procedure for identifying the candidate nodes by a traversal through the logic network from primary outputs to primary inputs.

To repeat, certain of the reconvergent fanout nodes define a boundary between optimizable logic and logic which must be duplicated, whereas only non-reconvergent fanout nodes in the optimizable logic region are candidates for minimizing logic duplication. These candidate nodes can be determined by traversing all the fanout nodes in the optimizable logic region and checking them for "disjoint" phase assignments, defined as follows. Two phase assignments $v\_i\_1, v\_i\_2, \ldots v\_i\_m$ and $v'\_i\_1, v'\_i\_2, \ldots v'\_i\_m$ are said to be disjoint if, and only if, for every output, $O\_j$, at least one of the corresponding phase assignment values $v\_i\_j$ and $v'\_i\_j$ is a don't care, i.e., for all j, either $v\_i\_j$=—, or $v'\_i\_j$=—. For example, phase assignments $v\_i$=[——PN—] and $v'\_i$=[—P——N] are disjoint. In comparison, phase assignments $v\_i$=[——PN—] and $v'\_i$=[—PP—N] are not disjoint, since for output O_3 both the phase assignments are defined, i.e., $v\_i\_3$=$v'\_i\_3$=P.

Procedure "candidate_nodes" in FIG. 8 gives the pseudo code of an algorithm to find candidate nodes for logic optimization in inverter-free logic synthesis.

Referring again to FIG. 7, an example illustrates finding candidate nodes. Nodes N_6 and N_9 are reconvergent fanout nodes defining the boundary between duplicated logic and optimizable logic regions, so they are not candidate nodes. In the optimizable logic region, only nodes N_1, N_2 and N_3, are fanout nodes to be considered for minimizing logic duplication by choosing an optimal output phase assignment.

Among the nodes remaining for consideration, all the phase assignments that fanout node N_3 receives from its fanout gates are non-disjoint, i.e., assignment [—,P] through gate G_2, and assignment [N,P] through gate G_5 are not disjoint. Thus, fanout node N_3 is a reconvergent fanout without a trapped inverter. Therefore, an inverter can never be trapped inside this loop by choosing any output phase assignment. This implies that node N_3 can also be eliminated as a candidate node for minimizing logic duplication, i.e., node N_3 is not a candidate node. This yields only two fanout nodes, N_1 and N_2, that are candidates for selecting an optimal output phase assignment. These candidate nodes, N_1 and N_2, can be utilized for selecting an output phase assignment for minimal logic duplication to obtain inverter free logic.

Having identified candidate nodes, as described above, is helpful, since every candidate fanout node in the optimizable logic region defines a phase assignment for primary outputs that will eliminate a trapped inverter or avoid an inverter being trapped. However, a phase assignment that eliminates an inverter in the fanout cone of one node may conflict with the phase assignment that would be required to eliminate inverters in the fanout cone of another node. This conflicting interdependence of output phase assignments enforced by two candidate nodes may be expressed in terms of an "incompatibility constraint" as follows. Candidate nodes are incompatible if they define at least one conflicting primary output phase assignment; otherwise they are compatible. In order to eliminate the inverters in both fanout cones of two incompatible candidate nodes, the logic fanin cone of at least one of them must be duplicated. In order to minimize logic duplication, the fanin cones of the two nodes must be compared. But, since it is already known that the logic gates in the duplicated logic region must be duplicated, only logic gates in the optimizable logic region are considered in this comparison.

Figure 7:
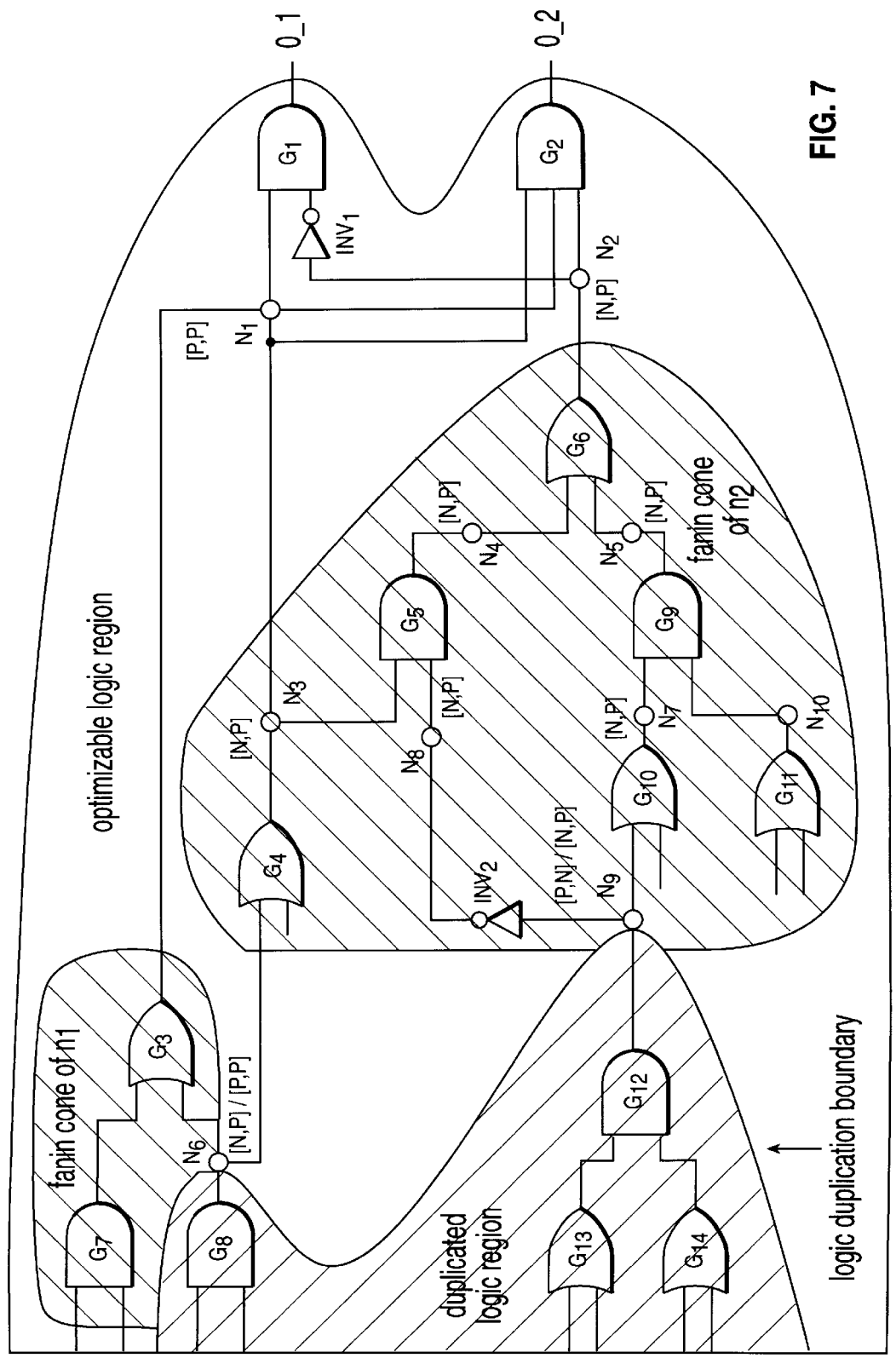
FIG. 7 illustrates a logic network 6 with output phase assignment vectors.

Consider the logic network shown in FIG. 7. As already discussed, this logic network has only two candidate nodes, N_1 and N_2. Candidate node N_1 defines an output phase assignment [P,P] to avoid inverter inv_2 being trapped; whereas candidate node N_2 defines an output phase assignment [N,P] for eliminating trapped inverter inv_1. Thus, nodes N_1 and N_2 are incompatible.

The inverter in the node N_1 fanout cone may be eliminated by output phase assignment, i.e., by node N_1 defining the output phase assignment. But then, because of the incompatibility of nodes N_1 and N_2, in order to eliminate the inverter in the fanout cone of node N_2, the fanin cone of node N_2 must be duplicated. The fanin cone of node N_2 has gates G_4, G_5, G_6, G_9, G_10, G_11, G_12, G_13 and G_14. However, gates G_12 through G_14 must be duplicated anyway, as earlier determined in connection with identifying the duplicated logic region. Therefore, gates G_12 through G_14 are not included in comparing logic duplication among the two alternative output phase assignments in this case.

Alternatively, the inverter in the node N_2 fanout cone may be eliminated by output phase assignment, i.e., by node N_2 defining the output phase assignment. But then, in order to eliminate the inverter in the fanout cone of node N_1, the fanin cone of node N_1 must be duplicated. The fanin cone of node N_1 has gates G_3, G_7 and G_8. Gate G_8 must be duplicated anyway, because, like gates G_12 through G_14, gate G_8 is also in the duplicated logic region. Therefore, gate G_8 is not included in the comparison of logic duplication for the purpose of choosing which node will determine the output phase assignment.

This comparison of alternatives yields only two logic gates to duplicate in the fanin cone of candidate node N_1, versus six in the fanin cone of candidate node N_2 (not counting the duplicated logic region for either fanin cone). Thus, output phase assignment [N,P] is the preferred choice because of its smaller duplication penalty. That is, the trapped inverter of the node N_2 fanout cone is eliminated by the output phase assignment which node N_2 defines, so that only the fanin cone of node N_1 must be duplicated to eliminate the inverter trapped in the fanout cone of node N_1.

Turning now to a more complicated example. Consider another case where there are numerous incompatible nodes. Suppose, for instance, that in a network (not shown) nodes N_1 and N_2 are incompatible; nodes N_2 and N_3 are incompatible; and nodes N_1 and N_6 are incompatible. All other nodes in the network are compatible. Thus, according to the terminology used herein, nodes N_1, N_2, N_3 and N_6 are, may be referred to generally as incompatible nodes, although it is understood that one incompatible node is incompatible with some particular one or ones of the other incompatible nodes. That is, while the group of nodes may be generally referred to as incompatible, further analysis will proceed to consider each incompatible pair of such nodes.

Because of these incompatibility constraints, at least one of each of the incompatible pairs of nodes must be selected for logic duplication. A set of nodes for assigning output phases is thus defined by this selection of at least one of each of the incompatible pairs of nodes. A collection of all possible such sets must be considered for determining the ideal selection of output phase assignment to minimize logic duplication.

To provide structure to these steps, the incompatibility constraints may be expressed in boolean terms. For the present example, this yields $F=(x\_1+x\_2)(x\_2+x\_3)(x\_1+x\_6)$, where node N_1 corresponds to boolean variable x_1, etc. A solution to this expression would be expressed, for example, as "1010", where the first digit of the expression signifies node N_1, the second digit signifies node N_2, the third digit signifies node N_3 and the fourth digit signifies node N_6, and where a "1" value for a digit indicates that the fanin cone for the corresponding node is selected to be duplicated, and a "0" value indicates that the corresponding node instead is selected to assign output phase(s). Thus, in the present example, 1010 represents a set of incompatible nodes for assigning output phases, obtained by selecting at least one of each of the incompatible pairs of nodes, wherein, in this instance the nodes selected for assigning output phases are nodes N_2 and N_6, and the nodes selected for duplicating logic are nodes N_1 and N_3.

The collection of all possible sets of nodes for assigning output phases, in this example, would thus be expressed as follows: 0101, 0111, 1010, 1011, 1100, 1101, 1110, and 1111. For each one of these sets of nodes, the potential logic duplication penalty must be considered. The preferred set is the one which results in the minimum duplication of logic, taking into account that the duplicated logic region must be duplicated regardless of anything else.

Figure 9:
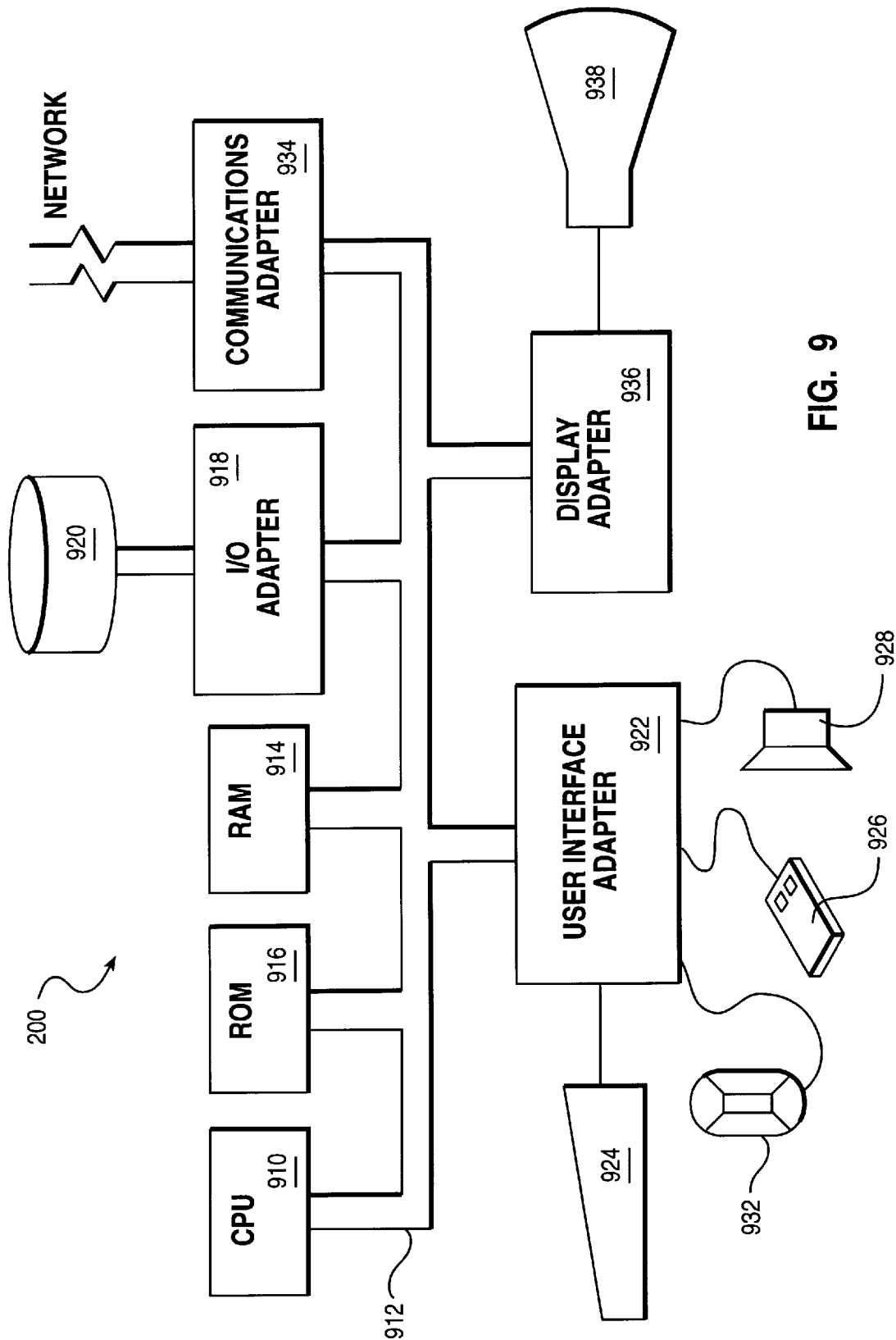
FIG. 9 illustrates an information handling system which may be used for the invention.

Referring now to FIG. 9, an example is shown of a data processing system 900 which may be used for the invention. The system has a central processing unit (CPU) 910, such as a PowerPC microprocessor ("PowerPC" is a trademark of IBM Corporation) according to "The PowerPC Architecture: A Specification for a New Family of RISC Processors", 2d edition, 1994, Cathy May, et al. Ed., which is hereby incorporated herein by reference. A more specific implementation of a PowerPC microprocessor is described in the "PowerPC 604 RISC Microprocessor User's Manual", 1994, IBM Corporation, which is hereby incorporated herein by reference. The history buffer (not shown) of the present invention is included in CPU 910. The CPU 910 is coupled to various other components by system bus 912. Read only memory ("ROM") 916 is coupled to the system bus 912 and includes a basic input/output system ("BIOS") that controls certain basic functions of the data processing system 900. Random access memory ("RAM") 914, I/O adapter 918, and communications adapter 934 are also coupled to the system bus 912. I/O adapter 918 may be a small computer system interface ("SCSI") adapter that communicates with a disk storage device 920. Communications adapter 934 interconnects bus 912 with an outside network enabling the data processing system to communication with other such systems. Input/Output devices are also connected to system bus 912 via user interface adapter 922 and display adapter 936. Keyboard 924, track ball 932, mouse 926 and speaker 928 are all interconnected to bus 912 via user interface adapter 922. Display monitor 938 is connected to system bus 912 by display adapter 936. In this manner, a user is capable of inputting to the system throughout the keyboard 924, track-ball 932 or mouse 926 and receiving output from the system via speaker 928 and display 938. Additionally, an operating system such as AIX ("AIX" is a trademark of the IBM Corporation) is used to coordinate the functions of the various components shown in FIG. 9.

Preferred implementations of the invention include implementations as a computer system programmed to execute the method or methods described herein, and as a computer program product. According to the computer system implementation, sets of instructions for executing the method or methods are resident in the random access memory 914 of one or more computer systems configured generally as described above. Until required by the computer system, the set of instructions may be stored as a computer program product in another computer memory, for example, in disk drive 920 (which may include a removable memory such as an optical disk or floppy disk for eventual use in the disk drive 920). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change. While it is convenient to describe the invention in terms of instructions, symbols, characters, or the like, the reader should remember that all of these and similar terms should be associated with the appropriate physical elements.

Note that the invention describes terms such as comparing, validating, selecting identifying or other terms that could be associated with a human operator. However, for at least a number of the operations described herein which form part of at least one of the embodiments, no action by a human operator is desirable. Those operations described are, in large part, machine operations processing electrical signals to generate other electrical signals.

Although the present invention and advantages have been described in detail, it should be understood that changes and substitutions can be made without departing from the spirit and scope of the invention as defined by the following claims.

What is claimed is:

1. A method for optimizing the design a logic network, comprising the steps of:

a) identifying, by a computer system analyzing an initial network design, logic gates of certain types within the initial network design;
 b) converting, by the computer system, any gates of other types to the certain types of gates;
 c) identifying, by the computer system in response to reconvergent fanout nodes in the network, each such node defining a loop having two branches which diverge at the node and converge thereafter, a region in the converted network for optimization;
 d) selecting within the region, by the computer system, some of the inverting gates of at least one of the certain types for moving to the network inputs;
 e) selecting within the region, by the computer system, others of the inverting gates of the at least one certain type for moving to the network outputs.

2. The method of claim 1, wherein the difference between the number of the at least one certain type of inverting gates in the two branches is an odd number.

3. The method of claim 2, wherein the region excludes that portion of the network which is in the fan-in cones of the reconvergent fanout nodes.

4. The method of claim 3, wherein the certain types include AND, OR and NOT gates.

5. The method of claim 4, wherein the at least one certain type includes NOT gates.

6. A computer aided method for optimizing the design of a logic network, wherein data is stored in a memory and processed by the computer, the method comprising the steps of:

storing data in the memory representing the logic network;
 processing the data by the computer, wherein the processing includes:
 a) identifying, by a computer system analyzing an initial network design, logic sates of certain types within the initial network design;
 b) converting, by the computer system, any sates of other types to the certain types of gates;
 c) identifying, by the computer system in response to reconvergent fanout nodes in the network, each such node defining a loop having two branches which diverge at the node and converge thereafter, a region in the converted network for optimization;
 d) selecting within the region, by the computer system, some of the inverting gates of at least one of the certain types for moving to the network inputs;
 e) selecting within the region, by the computer system, others of the inverting gates of the at least one certain type for moving to the network outputs.

7. The method of claim 6, wherein the difference between the number of the at least one certain type of inverting gates in the two branches is an odd number.

8. The method of claim 7, wherein the region excludes that portion of the network which is in the fan-in cones of the reconvergent fanout nodes.

9. The method of claim 8, wherein the certain types include AND, OR and NOT gates.

10. The method of claim 9, wherein the at least one certain type includes NOT gates.

11. A program storage device readable by a machine, tangibly embodying a program of instructions executable by the machine to perform method steps for optimizing the design of a logic network, said method steps comprising:

a) identifying, by a computer system analyzing an initial network design, logic gates of certain types within the initial network design;

b) converting, by the computer system, any sates of other types to the certain types of gates;

c) identifying, by the computer system in response to reconvergent fanout nodes in the network, each such node defining a loop having two branches which diverge at the node and converge thereafter, a region in the converted network for optimization;

d) selecting within the region, by the computer system, some of the inverting gates of at least one of the certain types for moving to the network inputs;

e) selecting within the region, by the computer system, others of the inverting gates of the at least one certain type for moving to the network outputs.

12. The device of claim 11, wherein the difference between the number of the at least one certain type of inverting gates in the two branches is an odd number.

13. The device of claim 12, wherein the region excludes that portion of the network which is in the fan-in cones of the reconvergent fanout nodes.

14. The device of claim 13, wherein the certain types include AND, OR and NOT gates.

15. The device of claim 14, wherein the at least one certain type includes NOT gates.

16. A system for optimizing the design of a logic network, comprising means for:

a) identifying, by a computer system analyzing an initial network design, logic gates of certain types within the initial network design;

b) converting, by the computer system, any gates of other types to the certain types of gates;

c) identifying, by the computer system in response to reconvergent fanout nodes in the network, each such node defining a loop having two branches which diverge at the node and converge thereafter, a region in the converted network for optimization;

d) selecting within the region, by the computer system, some of the inverting gates of at least one of the certain types for moving to the network inputs;

e) selecting within the region, by the computer system, others of the inverting gates of the at least one certain type for moving to the network outputs.

17. The system of claim 16, wherein the difference between the number of the at least one certain type of inverting gates in the two branches is an odd number.

18. The system of claim 17, wherein the region excludes that portion of the network which is in the fan-in cones of the reconvergent fanout nodes.

19. The device of claim 18, wherein the certain types include AND, OR and NOT gates.

20. The device of claim 19, wherein the at least one certain type includes NOT gates.

* * * * *

UNITED STATES PATENT AND TRADEMARK OFFICE
CERTIFICATE OF CORRECTION

PATENT NO : 6,018,621
DATED : January 25, 2000
INVENTOR(S) : Puri, et al

It is certified that error appears in the above-identified patent and that said Letters Patent are hereby corrected as shown below:

Column 10, line 36 of Claim 6 please delete "sates" and replace with --gates--;
line 38 of Claim 6 please delete "sates" and replace with --gates--.

Signed and Sealed this

Seventh Day of November, 2000

Attest:

Q. TODD DICKINSON

*Attesting Officer*      *Director of Patents and Trademarks*